United States Patent [19]

Ketchow

[11] 3,959,036
[45] May 25, 1976

[54] METHOD FOR THE PRODUCTION OF A GERMANIUM DOPED GAS CONTACT LAYER

[75] Inventor: Doris Rahb Ketchow, Kenilworth, N.J.

[73] Assignee: Bell Telephone Laboratories, Incorporated, Murray Hill, N.J.

[22] Filed: Aug. 28, 1974

[21] Appl. No.: 501,153

Related U.S. Application Data

[62] Division of Ser. No. 421,026, Dec. 3, 1973, Pat. No. 3,914,785.

[52] U.S. Cl. .............................. 148/171; 148/172; 148/1.5; 148/33.5; 252/62.3 GA
[51] Int. Cl.² ........................................... H01L 7/38
[58] Field of Search ............ 148/171, 172, 173, 1.5, 148/33.5; 252/62.3 GA

[56] References Cited
UNITED STATES PATENTS

| | | | |
|---|---|---|---|
| 3,447,976 | 6/1969 | Faust et al. | 148/1.5 |
| 3,530,011 | 9/1970 | Suzuki et al. | 148/1.5 |
| 3,551,219 | 12/1970 | Panish et al. | 148/171 |
| 3,600,240 | 8/1971 | Rupprecht et al. | 148/171 |
| 3,748,597 | 7/1973 | Reinhart | 148/171 X |

OTHER PUBLICATIONS

Hayashi et al., J. of Applied Physics, Vol. 42, No. 5, Apr. 1971, pp. 1929–1940.
Rosztoczy et al., J. Electrochem. Soc.: Solid–State Science and Technology, Vol. 119, No. 8, Aug. 1972, pp. 1119–1121.

*Primary Examiner*—G. Ozaki
*Attorney, Agent, or Firm*—A. N. Friedman

[57] ABSTRACT

A heavily germanium doped gallium arsenide layer is epitaxially deposited from solution on a Group III-V compound semiconductor device in order to provide contact between the device and external metallic circuitry. If the net p-type carrier concentration in the layer is greater than $3.5 \times 10^{19}$ per cubic centimeter, the blocking voltage between the device and common contacting metals, such as chromium and titanium is less than 50 millivolts. Deposition takes place at temperatures from 850°C to 700°C with germanium included in the solution in a concentration from 20 to 50 atom percent.

10 Claims, 3 Drawing Figures

METHOD FOR THE PRODUCTION OF A GERMANIUM DOPED GAS CONTACT LAYER

CROSS REFERENCE TO RELATED APPLICATION

This application is a division of my copending application, Ser. No. 421,026 filed Dec. 3, 1973 now U.S. Pat. No. 3,914,785.

BACKGROUND OF THE INVENTION

1. Field of the Invention

The invention concerns the provision of electrical contact to Group III-V compound semiconductor devices.

2. Brief Description of the Prior Art

A recurrent problem in the design and fabrication of semiconductor devices is the provision of an electrical contact between the device and external metallic circuitry. The general requirement is that the contact be "ohmic" or nonrectifying so that the properties of the contact itself do not affect the nonlinear properties of the device contacted. The direct application of a metal to a semiconductor, doped to a carrier concentration appropriate to common device use produces a contact which is itself a rectifying diode. In order to solve this problem many techniques have been developed involving alloying or diffusion steps to produce a transition region of heavily doped semiconductor between the active portion of the semiconductor device and the metallic contact. For example, zinc diffusion, to a carrier concentration of approximately $10^{20}$ per cubic centimeter into gallium arsenide, has been used to provide ohmic contact to the p-type portion of gallium arsenide devices (Ripper et al, IEEE Journal of Quantum Electronics, QE6 (1970) 300). This solution to the contact problem requires separate evaporation and diffusion steps subsequent to the processing which results in the formation of the active device.

Recently developed Group III–V semiconductor devices have been produced by the liquid phase epitaxial deposition of succeeding layers of semiconductor in a single processing sequence (Hayashi et al, Applied Physics Letters, 17 (1970) 109). It would be desirable to produce the heavily doped region, required for ohmic contact, by merely providing an extra step in this epitaxial deposition sequence. Although germanium is a known dopant for gallium arsenide, producing p-type conductivity under certain growth conditions (Journal of Physics and Chemistry of Solids, 28 (1967) 2397, Japanese Journal of Applied Physics, 8 (1969) 348), previous work has indicated an inability to produce carrier concentrations sufficiently high (i.e., greater than $3.5 \times 10^{19}$) to produce ohmic contacts (Journal of Applied Physics, 41 (1970) 264).

SUMMARY OF THE INVENTION

It has been found that germanium doped gallium arsenide, deposited by liquid phase epitaxy at lower temperatures than heretofore used in this context, can be made to possess a high enough p-type carrier concentration to provide ohmic contact between a Group III-V compound semiconductor device and external metallic circuitry. While it is true that, depositing from limited solution layers, the lower solubility of the semiconductor in the solution necessitates larger amounts of solution to produce the desired layer thickness, the economies produced by incorporating the production of the high carrier concentration region into the previous growth sequence justifies the possibly greater expenditure of raw materials. When liquid phase epitaxial growth is initiated at 850°C or less with a germanium concentration in the solution between 20 atom percent and 50 atom percent, smooth deposits with p-type carrier concentrations greater than $3.5 \times 10^{19}$ per cubic centimeter are produced. These carrier concentrations are sufficiently high to produce contact with less than 50 millivolts blocking voltage to such commonly used metallic contacting layers as chromium and titanium. This is a sufficiently low blocking voltage to be considered "ohmic" within the requirement of most presently contemplated semiconductor devices.

DETAILED DESCRIPTION OF THE INVENTION

Semiconductor-Metal Contacts

Figure 1:
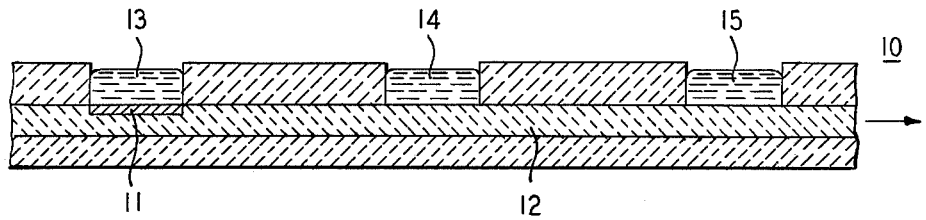
FIG. 1 is an elevational view in section of an exemplary liquid phase epitaxial growth apparatus.

Connection of a semiconductor device to external metallic circuitry presents the problem of nonlinearities usually present at the contact between a semiconductor, doped to typical device doping levels, and a metal. Although such nonlinearities may be a desired part of the overall device characteristic (i.e., in a Schottky barrier diode), they are usually undesirable. These nonlinearities are expressable in terms of a "blocking voltage" at the contact. This blocking voltage is determined by measuring the forward bias current-voltage characteristic across this contact and extrapolating the linear portion back to zero current. A contact possessing a blocking voltage low enough to be negligible relative to the characteristics of the rest of the device is often referred to as "ohmic." The material under such contacts still possesses a linear series resistance. It is usually desirable to minimize this series resistance.

The most common techniques for producing low blocking voltage (ohmic) contacts involve the production of a high carrier concentration region of semiconductor material at the contact to the metal. This has been done by such methods as the alloying or diffusing of dopants into the device where the contact is to be made. In some material systems, liquid phase epitaxy can produce high enough carrier concentrations to serve this function. This high carrier concentration region can serve as merely a transition region between an underlying region of the same conductivity type and the external metallic circuitry. Alternatively, the contact between the high carrier concentration region and the underlying region can provide a desired part of the device characteristic.

Liquid Phase Epitaxial (LPE) Crystal Growth

The growth, upon a substrate crystal, of a crystalline layer from a contacting nutrient solution (LPE crystal growth) has been widely applied to the Group III-V compound semiconductors. In this method the nutrient solution is primarily a nonstoichiometric melt of the two major constituents, rich in the Group III constituent. This is often produced by dissolving a quantity of the compound semiconductor in a quantity of the pure Group III constituent. For example, gallium phosphide epitaxial layers are grown from a melt whose major constituents are gallium phosphide dissolved in gallium. The relative quantities of these constituents are chosen (by reference to the appropriate phase diagram — Journal of the Physics and Chemistry of Solids, 26 (1965) 789) so as to produce a saturated solution at the temperature at which growth is desired to be initiated. As the temperature is reduced a crystalline layer is deposited on the substrate. In addition to these constituents, minor quantities of additional species are included as dopants in order to modify such device properties as the electrical conductivity and the luminescent efficiency of the grown crystalline layer.

The conductivity determining dopants used in conjunction with the Group III-V compound semiconductors can be put in the following three classes:

1. The donor dopants which provide n-type or electronic conductivity are primarily the Group VI elements such as sulphur, selenium and tellurium.

2. The acceptor dopants which provide p-type or hole conductivity are primarily the Group II elements such as zinc, cadmium and mercury.

3. Group IV elements such as silicon, germanium, tin and lead are amphoteric dopants, providing n-type or p-type conductivity depending on growth conditions. It is considered that the carrier contribution of these impurities is related to the difference between substitution on Group III sites and substitution on Group V sites in the semiconductor lattice.

Ge Doped GaAs

Germanium is a desirable dopant in Group III-V compound semiconductor materials in that it possesses a relatively low diffusion mobility. Of special importance at high doping levels, the germanium will remain where deposited and not migrate inordinately within the device during further deposition or other high temperature processing. Devices (e.g., laser diodes) possessing thin layers of other dopings, adjacent to a highly doped region are especially sensitive to such migration. Germanium doped gallium arsenide layers are produced by liquid phase epitaxial depositions with carrier concentrations greater than $3.5 \times 10^{19}$ per cubic centimeter when liquid phase epitaxial deposit is initiated at temperature of 850°C or less from growth solutions containing between 20 and 50 atom percent germanium, the concentration being expressed as a percentage of the sum of all constituents of the solution. Such highly doped layers are desired in order to provide ohmic contact between Group III-V compound semiconductor devices and external metallic circuitry, particularly such widely used contact metals as chromium and titanium. For the purposes of this invention such contacts are considered ohmic when the blocking voltage observed at the contact is less than 50 millivolts. A preferred maximum growth temperature, resulting in blocking voltages less than 10 millivolts, is 800°C. Temperatures below 700°C are undesirable because of the inordinately low solubility of GaAs in Ga at such temperatures.

A preferred concentration range for germanium in the growth solution is from 25 to 45 atom percent. This range provides, at the lower end, lower blocking voltage and, at the upper end deposited layers of higher crystalline quality than layers deposited at higher temperatures.

The gallium arsenide concentration in the gallium solution, the amount of solution needed, the temperature difference in which epitaxial growth takes place and the thickness of the grown layer are interrelated. The relationship is determined by reference to the gallium-arsenic-germanium phase diagram (M. B. Panish, J. Less-Common Metals 110, 416 (1966)). (While the total inclusion of Ge can be estimated using this phase diagram, the carrier concentration produced by this amphoteric dopant is not simply related to Ge inclusion.) The temperature difference should be at least 0.5 centigrade degrees in order to make economic use of the constituents of the solution. The grown layer should be at least one-half micrometer in thickness to provide reliable ohmic contact. Layers greater than 25 micrometers thick are uneconomic and only serve to increase the series resistance of the fabricated device.

FIG. 1 shows an exemplary liquid phase epitaxial growth apparatus for the production of a multi-layer semiconductor device. In this apparatus 10 the semiconductor wafer 11 is held in a sliding plate 12 such that the wafer 11 can be successively brought into contact with three separate portions 13, 14, 15 of growth solution. The compositions of these portions of growth solution are selected in accordance with the desired performance of the fabricated semiconductor device. In order to accomplish epitaxial growth the temperature of the apparatus 10 is reduced by predetermined amounts while the wafer 11 is maintained in contact with each of the solution portions 13, 14, 15. As contemplated by the invention disclosed here the composition of the solution portion 15 is such as to produce the highly doped p-type layer required for low blocking voltage contact to the finished device.

Figure 2:
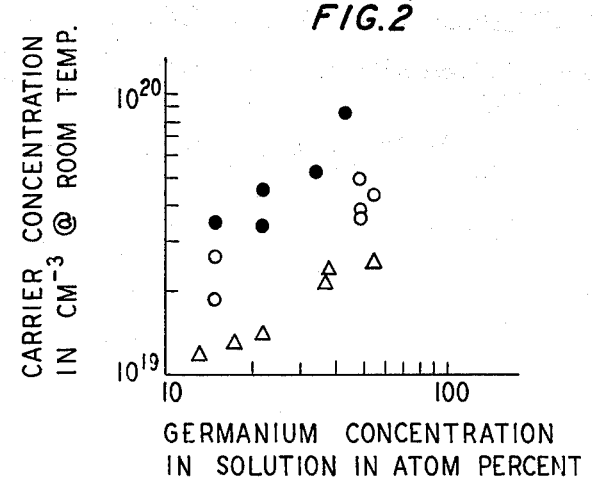
FIG. 2 is a graph showing the p-type carrier concentration (ordinate) in liquid phase epitaxially deposited gallium arsenide as a function of the germanium concentration in the growth solution (abscissa) and, FIG. 3 is an elevational view in section of an exemplary multilayer Group III-V compound semiconductor device.

FIG. 2 shows the carrier concentrations of such layers as a function of the quantity of germanium in the growth solution. The data points indicated by filled circles indicate the results of growth on <111> planes and when growth was initiated at 800°C with the germanium concentrations of the solution as indicated. The open circles indicate data observed for similar growth on <100> crystalline surfaces. The open triangles indicate the results of prior art attempts to grow highly doped layers (Journal of Applied Physics, 41 (1970) 264).

Figure 3:
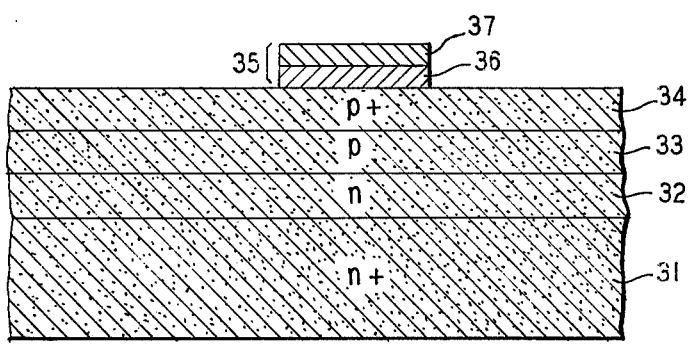

FIG. 3 shows an exemplary fabricated device with a heavily n-doped substrate 31 upon which are deposited an n-layer 32 and a p-layer 33, forming a p-n junction and a heavily doped p-layer 34 forming a transition layer between the active portion of the device 32, 33 and the metallic contact 35. The illustrated metallic contact 35 is a composite of a contacting metal 36 such as chromium or titanium and a more highly conducting metal 37 such as gold. Such contacts are usually applied by one or a combination of techniques such as evaporation coating, sputtering or plating. The highly doped transition layer 34 disclosed here is particularly advantageous in devices which are predominantly (at least 90 percent by volume) GaAs. One class of devices which can be fabricated in this way is the heterojunction GaAs diode laser. This device includes low index intermediate layers 32, 33 of gallium-aluminum arsenide ($Ga_{1-x}Al_xAs$; where $0.1 \quad \times \quad 0.4$).

EXAMPLES

A wafer for use as a heterojunction laser diode was processed as follows:

1. Load a 4 position deposition boat with the following constituents:

| First: | 3.7 gm — Ga; 0.23 gm — GaAs; 1.0 gm — Sn; 0.002 gm — Al |
| --- | --- |
| Second: | 5.1 gm — Ga; 0.29 gm — GaAs; 0.006 gm — Ge |
| Third: | 4.8 gm — Ga; 0.24 gm — GaAs; 0.09 gm — Ge; 0.003 gm — Al |
| Fourth: | 3.3 gm — Ga; 0.30 gm — GaAs; 1.5 gm — Ge (~30 atom %). |

2. Insert a n-type GaAs <100> substrate wafer.
3. Grow the first three layers by successively positioning the substrate wafer beneath the first three growth solutions and reducing the temperature of the deposition boat by selected intervals, producing layers which are respectively n-type, p-type and p-type.
4. Position the wafer beneath the fourth solution at 794.5°C. Cool the deposition boat to 793.4°C in 12 minutes.
5. Remove wafer from contact with fourth solution and cool apparatus to room temperature.

This process produced a diode laser wafer with no observed blocking voltage in the contact between the heavily doped p-type region (fourth layer) and a contacting metal.

What is claimed is:

1. Method for the production of a semiconductor device comprising
   1. contacting a body of Group III-V compound semiconductor material with a solution, which solution contains gallium, as solvent, and gallium arsenide together with at least one conductivity-determining dopant, as solutes, at a first temperature;
   2. reducing the temperature of the body and the solution to a second temperature resulting in the epitaxial deposition of a crystalline layer of gallium arsenide, together with at least one conductivity-determining dopant, on the body; and
   3. applying metal to the deposited layer CHARACTERIZED IN THAT the solution includes germanium as a conductivity-determining dopant in a concentration from 20 to 50 atom percent, the first temperature and the second temperature are from 850°C to 700°C and the temperature difference between the first temperature and the second temperature is at least 0.5 centigrade degrees.

2. Method of claim 1 in which the portion of the body upon which epitaxial deposition takes place is p-type.

3. Method of claim 1 in which the body of Group III-V compound semiconductor material contains a p-n junction.

4. Method of claim 3 in which the body of Group III-V compound semiconductor material consists, at least 90 percent by volume, of GaAs.

5. Method of claim 4 in which the body of Group III-V compound semiconductor includes a low index portion consisting of $Ga_{1-x}Al_xAs$, where x assumes at least one value between 0.1 and 0.4.

6. Method of claim 4 in which the solution contains germanium is a concentration from 25 to 45 atom percent.

7. Method of claim 4 in which the deposited layer is from 0.5 micrometers to 25 micrometers in thickness.

8. Method of claim 7 in which the first temperature is from less than 800°C.

9. Method of claim 1 in which the portion of the metal in contact with the deposited layer is chromium or titanium.

10. Method for the production of a semiconductor device comprising
    1. contacting a body of Group III-V compound semiconductor material with a solution, which solution contains gallium, as solvent, and gallium arsenide together with at least one conductivity-determining dopant, as solutes, at a first temperature; and
    2. reducing the temperature of the body and the solution to a second temperature resulting in the epitaxial deposition of a crystalline layer of gallium arsenide, together with at least one conductivity-determining dopant, on the body CHARACTERIZED IN THAT the solution includes germanium as a conductivity-determining dopant in a concentration from 20 to 50 atom percent, the first temperature and the second temperature are from 850°C to 700°C and the temperature difference between the first temperature and the second temperature is at least 0.5 centigrade degrees.

* * * * *

UNITED STATES PATENT AND TRADEMARK OFFICE
CERTIFICATE OF CORRECTION

PATENT NO. : 3,959,036
DATED : May 25, 1976
INVENTOR(S) : Doris R. Ketchow

It is certified that error appears in the above-identified patent and that said Letters Patent are hereby corrected as shown below:

The Title should read --Method for the Production of a Germanium Doped GaAs Contact Layer--.

Column 4, line 68, "0.1　　X　　0.4)." should read --$0.1 \leq x \leq 0.4)$.--.

Signed and Sealed this

Thirty-first Day of August 1976

[SEAL]

Attest:

RUTH C. MASON
*Attesting Officer*

C. MARSHALL DANN
*Commissioner of Patents and Trademarks*